(12) United States Patent
Smiljanic

(10) Patent No.: US 8,263,951 B2
(45) Date of Patent: Sep. 11, 2012

(54) SYSTEM AND METHOD FOR FABRICATING MACROSCOPIC OBJECTS, AND NANO-ASSEMBLED OBJECTS OBTAINED THEREWITH

(75) Inventor: Olivier Smiljanic, Montreal (CA)

(73) Assignee: Fablab Inc., Montreal (CA)

( * ) Notice: Subject to any disclaimer, the term of this patent is extended or adjusted under 35 U.S.C. 154(b) by 98 days.

(21) Appl. No.: 12/997,023

(22) PCT Filed: Jun. 12, 2009

(86) PCT No.: PCT/CA2009/000832
§ 371 (c)(1),
(2), (4) Date: Dec. 9, 2010

(87) PCT Pub. No.: WO2009/149563
PCT Pub. Date: Dec. 17, 2009

(65) Prior Publication Data
US 2011/0095198 A1    Apr. 28, 2011

Related U.S. Application Data

(60) Provisional application No. 61/061,187, filed on Jun. 13, 2008.

(51) Int. Cl.
*H01J 3/14* (2006.01)
(52) U.S. Cl. .................................................. 250/492.1
(58) Field of Classification Search ............... 250/492.1
See application file for complete search history.

(56) References Cited

U.S. PATENT DOCUMENTS

| | | | |
|---|---|---|---|
| 5,096,558 | A | 3/1992 | Ehrich |
| 5,444,332 | A | 8/1995 | Chang et al. |
| 6,784,085 | B2 | 8/2004 | Cuomo et al. |
| 6,787,010 | B2 | 9/2004 | Cuomo et al. |
| 6,899,054 | B1 * | 5/2005 | Bardos et al. .......... 118/723 MW |
| 7,014,889 | B2 * | 3/2006 | Groves et al. ................. 427/569 |
| 7,147,894 | B2 | 12/2006 | Zhou et al. |
| 7,537,722 | B2 * | 5/2009 | Andersson et al. .......... 264/497 |
| 2005/0034668 | A1 | 2/2005 | Garvey et al. |
| 2006/0003097 | A1 | 1/2006 | Andres et al. |

FOREIGN PATENT DOCUMENTS

| | | |
|---|---|---|
| CA | 1325793 | 1/1994 |
| CA | 2205576 | 5/1996 |
| CA | 2411174 | 11/2001 |
| DE | 19804838 | 5/1999 |
| WO | 2001/39560 | 5/2001 |
| WO | 2007/136777 | 11/2007 |

* cited by examiner

*Primary Examiner* — Kiet T Nguyen
(74) *Attorney, Agent, or Firm* — Goudreau Gage Dubuc; Gwendoline Bruneau

(57) ABSTRACT

A method and a system for fabricating a macroscopic object, comprising, in an environment at least one energy source; at least one hollow cathode separated from an anode by a bias potential; and a support; a flow of gas through the hollow cathode generating a hollow cathode discharge, particles emitted by the hollow cathode being assembled on the support under action of energy from the energy source.

39 Claims, 5 Drawing Sheets

SYSTEM AND METHOD FOR FABRICATING MACROSCOPIC OBJECTS, AND NANO-ASSEMBLED OBJECTS OBTAINED THEREWITH

CROSS-REFERENCE TO RELATED APPLICATIONS

This application is a National Entry Application of PCT application no CA2009/000832 filed on Jun. 12, 2009 and published in English under PCT Article 21(2), which itself claims benefit of U.S. provisional application Ser. No. 61/061,187, filed on Jun. 13, 2008. All documents above are incorporated herein in their entirety by reference.

FIELD OF THE INVENTION

The present invention relates to a system and a method for fabricating macroscopic objects. More specifically, the present invention is concerned with a system and a method for fabricating macroscopic objects by assembling nanoparticles.

BACKGROUND OF THE INVENTION

Generally, macroscopic objects, i.e. objects whose largest dimension is more than one millimeter, are fabricated by machining and/or molding techniques.

Alternatively, additive fabrication, also referred to as rapid prototyping or rapid manufacturing, is used to fabricate macroscopic objects, using polymers and metal materials. A primary advantage of additive fabrication is its ability to create almost any shape or geometric feature. Moreover, while construction of a model with standard methods can be impossible depending on the complexity of the model, additive systems for rapid prototyping can typically produce models in a few hours, depending on the type of machine being used and on the size and number of models being produced simultaneously.

In additive fabrication, metallic objects are usually made from metallic powders that are melted by a high power laser and laid down in successive layers to build up the objects from a series of cross sections. The metallic powder is added to the surface of the objects being fabricated, this surface being held at the fusion temperature. Therefore, it is necessary to tightly control the temperature of the surface of the object. Fabricating high precision objects proves difficult. Moreover, the resulting objects need to be heated and rectified for the purpose of releasing internal strains caused by thermal deformations during the addition of matter. As a result, additive fabrication techniques are used only with a limited range of metals alloys or ceramics. Moreover, it is found that properties of the resulting objects are at most equal to objects fabricated by machining techniques.

There is a need for a method and a system for fabricating macroscopic objects, alleviating shortcomings of the prior art.

FIELD OF THE INVENTION

There is provided a system for fabricating a macroscopic object, comprising, in an environment at least one energy source, at least one particle generator; and a support; wherein particles emitted by the particle generator are assembled on the support under action of energy from the energy source.

There is further provided a method for fabricating an object on a support in an environment, comprising selecting at least one hollow cathode according to a composition of the object to be fabricated; selecting at least one energy source according to a size of the object to be fabricated; starting a flow of gas through the hollow cathode; establishing a potential bias between the hollow cathode and an anode at a controlled pressure satisfying:

$$V = \frac{a(pd)}{\ln(pd) + b}$$

where V is a breakdown voltage in Volts, p is the pressure in Torr, and d is a distance in cm between opposite walls of the hollow cathode in the gas, constants a and b depending on the composition of the gas; starting the energy source; and directing a beam of particles emitted by the hollow cathode and energy from the energy source to the support.

There is further provided a method for fabricating an object on a support in an environment, comprising selecting at least one particle generator according to a composition of the object to be fabricated; selecting at least one energy source according to a size of the object to be fabricated; starting the particle generator; starting the energy source; and directing a beam of particles emitted by the particle generator and energy from the energy source to the support.

Other objects, advantages and features of the present invention will become more apparent upon reading of the following non-restrictive description of specific embodiments thereof, given by way of example only with reference to the accompanying drawings.

DESCRIPTION OF ILLUSTRATIVE EMBODIMENTS

The present invention is illustrated in further details by the following non-limiting examples.

The present method and system allow assembling particles, including atoms, in the form of vapor or plasma, atomic clusters or nanoparticles, or a mixture thereof, to fabricate macroscopic objects. As known in the art, a nanoparticle has at least one of its dimensions in the nanometer range, usually less than 100 nm. In the present invention, most of these particles are generated in-situ and assembled using an energy source. Nanoparticles made ex-situ can also be added and assembled to the in-situ generated ones, using an energy source. The energy source can be local, directional or diffuse. A combination of sources can be used. Reactive gases can also be added and mixed to the particles, in order to react therewith.

Figure 1:
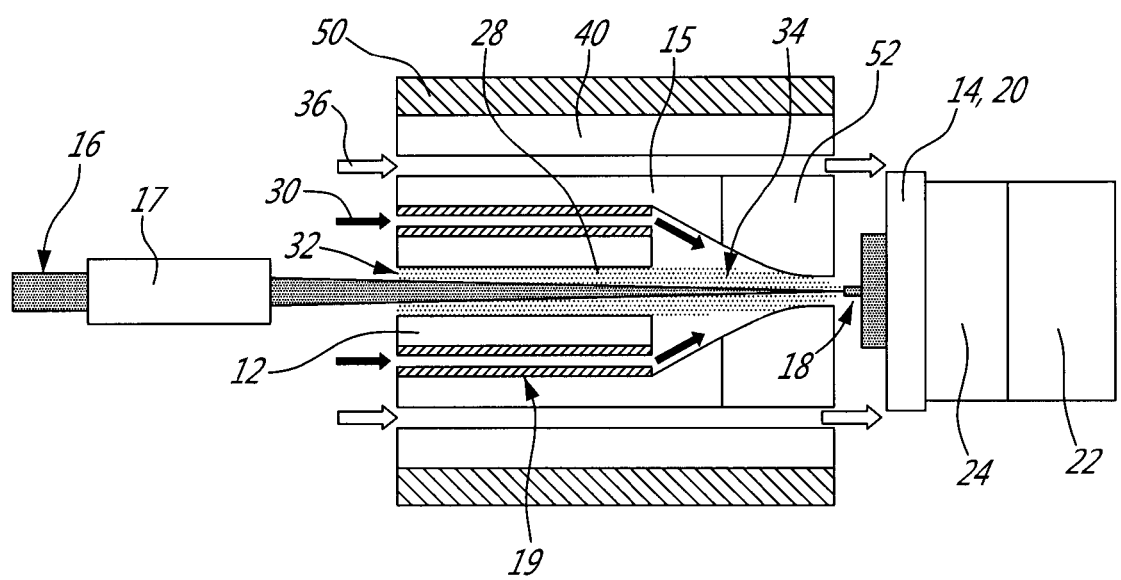
FIG. 1 is a schematical view of a first embodiment of a system according to an aspect of the present invention.
Figure 2:
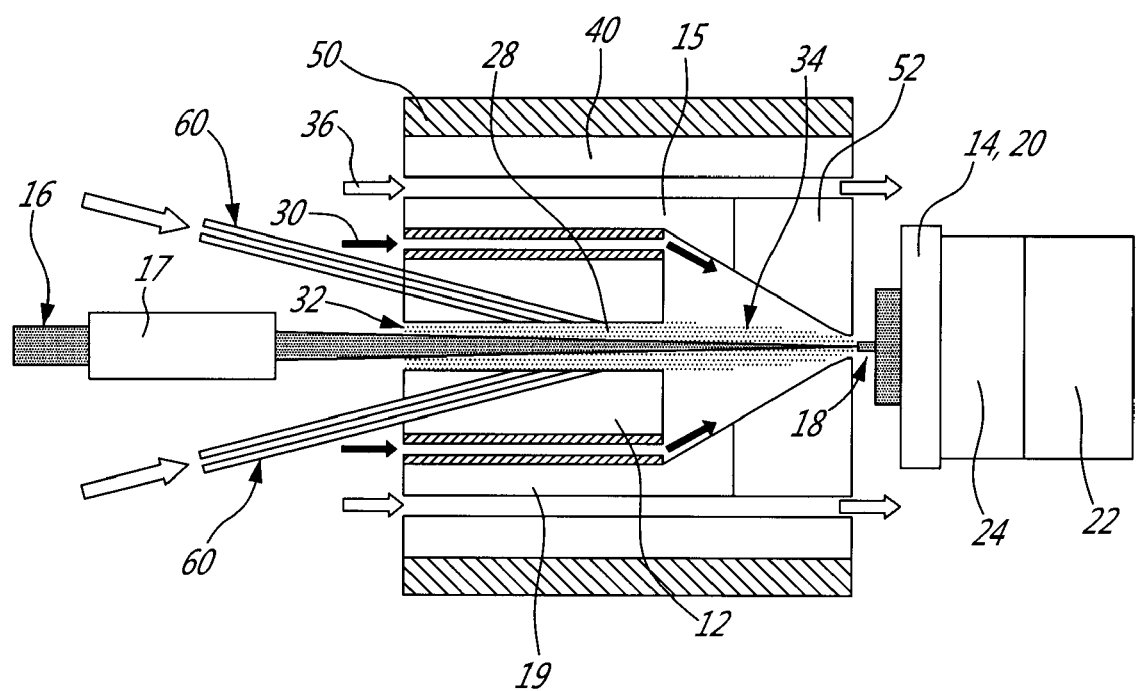
FIG. 2 is a schematical view of a second embodiment of a system according to an aspect of the present invention.
Figure 3:
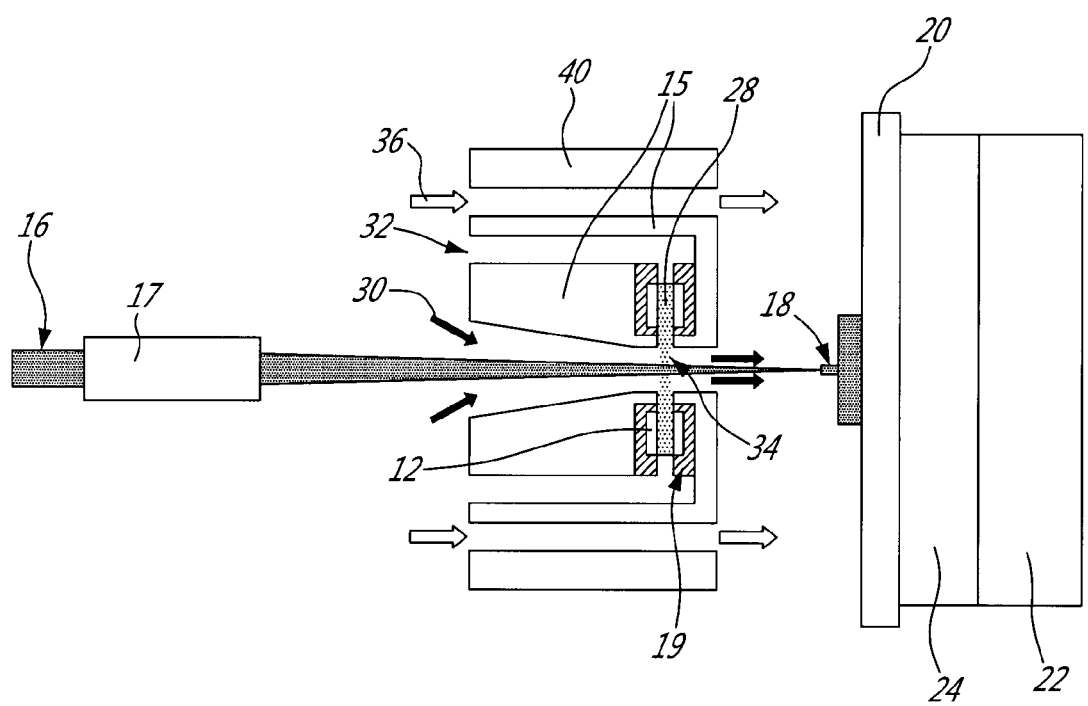
FIG. 3 is a schematical view of another embodiment of a system according to an aspect of the present invention.

A system according to a first embodiment, as illustrated in FIGS. 1-3 generally comprises an energy source, a particle generator, and a support, in an environment.

The particle generator generates particles in situ. Particles can be generated in situ by vaporizing materials or by laser ablation for example. In FIG. 1, the particle generator comprises a hollow cathode 12 and an anode 15 housed in a manufacturing head body 40, which can be either electrically conductive or insulating. The energy source 16 is typically exterior to the manufacturing head and the energy beam is provided from the energy source 16 through optical fibers or an optical setup, or any other device compatible with the type of energy source used, as known in the art. The body 40 has an inlet port for the energy beam from the energy source 16, via a collimating or a focusing device 17, when needed.

The support comprises a plate 20, where the manufacturing of the object 26 takes place at a fabrication point 18. The plate 20 can be either electrically conductive or insulating, and its temperature is usually controlled by a temperature controlling unit 22. Preferably, the plate 20 is not a thermal insulator. As described in the following, a DC bias can be connected to the plate 20, and in that case an electrical insulator 24 is installed between the plate 20 and the temperature controlling unit 22, so as to indirectly control the temperature at the fabrication point 18.

The hollow cathode 12 can have different geometries: tubes, arrays of tubes, parallel plates, array of plates, or other geometry, provided the inside cathode geometry permits the hollow cathode effect, as will be explained hereinbelow. Any metal or alloy being in a solid state at working temperature (so that the cathode does not melt during use) can be used. Non metals such as doped silicon, carbon, etc., can also be used as long as the material is electrically conductive and in a solid state at working temperature, so that the cathode does not melt. The temperature of the hollow cathode 12 can be controlled or not so as to prevent overheating.

The system can have a cylindrical symmetry, relative to the axis of the energy beam from the energy source 16 or a plane symmetry in cases when opposite plates connected together form the hollow cathode 12, in which case the energy beam forms the image of a line on the object being fabricated, instead of a point.

When working with a DC current, the hollow cathode 12 is put under a negative DC tension, below −100V, typically in the range between −137V and −1000V, with a current typically in the range between 10 mA and 100 A for example, under a pressure in the range between a few mTorr and atmospheric pressure, depending on the geometry of the hollow cathode 12 and according to Paschen's law:

$$V = \frac{a(pd)}{\ln(pd) + b}$$

where V is the breakdown voltage in Volts, p is the pressure, and d is the distance between parallel plates in a gas, i.e. here, it is the distance between opposite walls inside the hollow cathode as described hereinbelow. The constants a and b depend on the composition of the gas.

Pressures of a few hundred Torr prove to be less efficient.

In terms of power density, a range between 10 and 2000 W/cm$^2$, or between 100 and 1000 W/cm$^2$ is found to be effective.

Usually, the positive pole of the DC power supply is connected to the anode 15 of the manufacturing head 40, especially if the object 26 being fabricated is not conductive, for example when it is made in ceramic. When the object being fabricated 26 is made of a conductive material, the positive pole of the power supply can be connected to the support 20, provided the support 20 is conductive. However, when both the support and the object being fabricated are electrically conductive, the anode can be positioned either in the particle generator (in 15) or on the support (in 14).

Usually, in a fabrication chamber used to achieve the desired environment; the anode 15 of the manufacturing head 40, or the anode 14 on the support, depending of the position 14, 15 of the anode, and the positive pole of the power supply are grounded to avoid floating potentials and sparks inside the fabrication chamber, or between different elements inside the fabrication chamber.

Alternatively, AC current, in the range between 10 W and 10 KW for example, can be applied to the hollow cathode 12, depending on the size of the hollow cathode 12 and its cooling requirements, at RF such as 13.54 MHz for example. The plate 20 can be put under a DC tension so as to create an additional potential difference or bias between the hollow cathode 12 and the object being fabricated, thereby allowing a controlled deposition of material on the support 20, for a precise fabrication.

High pressure and/or high power hollow cathodes, as described in U.S. Pat. No. 5,444,332 for example, can also be used.

The hollow cathode 12 can further be fed from an extra source of material 60 under the form of a plate, in case of a planar symmetry, or a wire, in case of a cylindrical symmetry, as shown in FIG. 2, for compensating the waste of material from the hollow cathode during the process.

Figure 4:
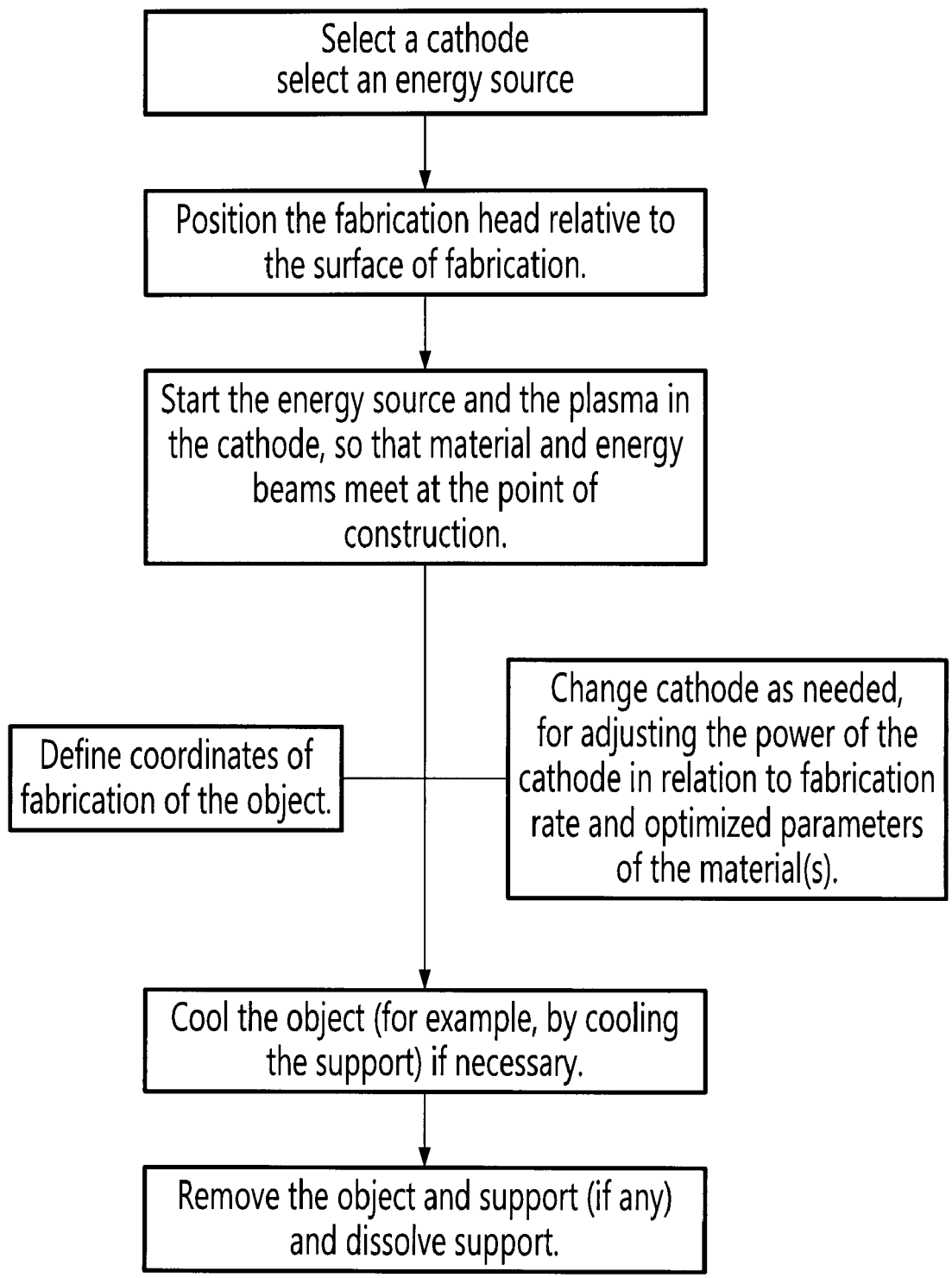
FIG. 4 is a flowchart of a general method according to an embodiment of a second aspect of the present invention.

According to a second aspect of the present invention, as shown in FIG. 4, a method generally comprises selecting a hollow cathode according to the composition of the object to be fabricated; selecting an energy source according to a size of the object to be fabricated, positioning the fabrication head relative to the surface of fabrication; and starting the energy source and the plasma in the hollow cathode so that material and energy beams meet at the point of construction on the surface of fabrication. The hollow cathode may be changed as needed for adjusting the power of the plasma in relation to the fabrication rate and optimized parameters of the material(s) as will be described hereinbelow. The object once formed is cooled down, for example by cooling the support, if necessary. The object is then removed from the support, or the support is dissolved as will be described hereinbelow.

The environment can be a vacuum chamber, a controlled atmosphere chamber, or air, or space, provided the gas surrounding the fabrication point 18 is compatible with the material(s) used for fabricating the object 26, and the pressure is compatible with the dimensions of the hollow cathode, to obtain a hollow cathode discharge as described hereinabove. For example, and not limiting thereto, a noble gas, such as argon for example, can be used for fabricating a metallic object in a vacuum chamber with a small percentage of hydrogen to avoid oxidation of the metal coming from the hollow cathode.

As shown in FIGS. 1-3, a flow 32 of noble gas, for example, such as argon for example (other gases, or mixtures of gases can also be used), is injected through the hollow cathode 12 simultaneously with the beam of energy from the energy source 16, and controlled with a mass flow controller, so as to enter and exit the hollow cathode 12 without spilling. Typically, the total gas flow through the hollow cathode 12 varies between 1 sccm (standard cubic centimeters per minute) and 10000 sccm. The total gas flow through the hollow cathode 12 can be higher, depending on the size and geometry of the hollow cathode 12. For example, in the case when the hollow cathode 12 is made up of an array of hollow cathodes, the different hollow cathodes can be arranged as a ring as shown in FIG. 3 for example and gases and particles made to flow through the ring.

The pressure inside the hollow cathode 12 during fabrication must be sufficient to obtain a hollow cathode discharge. When working in air, a gas sheath 36 can be passed through the body 40, in order to keep a compatible environment with the materials used for the manufacturing of the object. The gas sheath can also be used in space, to help maintaining a local pressure necessary for the manufacturing of the object.

The tension between the hollow cathode 12 and the anode creates a breakdown of the gas, which creates a plasma 28 inside the hollow cathode 12. An insulating material 19 is provided between the hollow cathode 12 and the anode 15 so as to prevent formation of plasma therebetween. The positive gas ions of the plasma 28 are forcefully accelerated by the plasma sheath formed at the inner surface of the hollow cathode 12 and crash on this inner surface. Such acceleration allows ablating atoms from the hollow cathode 12, which in turn participate in ablating further atoms therefrom.

Due to the existence of the plasma sheath in the hollow cathode geometry, a hollow cathode discharge (HCD) effect as known in the art arises in the hollow cathode. The origin of the HCD is an entrapment of electrons inside the hollow cathode when energetic electrons emitted from one cathode wall are accelerated across the sheath towards the opposite cathode wall. When they reach the identical sheath on the opposite side with the same but opposite electric field they are reflected back. The electrons are trapped and forced to oscillate between the opposite sheaths. This mechanism is called the "hollow cathode effect". During these oscillations electrons can undergo inelastic collisions with gas atoms and increase the probability for ionization giving a very dense plasma inside the hollow cathode. This plasma is forced out of the hollow cathode by flowing gas. When the hollow cathode is powered by an RF power supply, the electrons can oscillate many times during one RF cycle giving a high plasma density. The positive ions formed in the HCD are attracted by the hollow cathode, since the cathode is negative, and accelerated towards the sheath. They acquire sufficient energy to sputter the hollow cathode 12 and create the dense plasma 28. As a result, the hollow cathode 12 emits nanoparticles and/or atomic clusters and/or atomic vapors or plasma 34, which are then directed to the point of fabrication 18 of the object 26.

Efficiency of the plasma can be increased under application of a transverse or parallel electromagnetic field (see for example permanent magnet or coil 50 in FIGS. 1 and 2 for example) thereby allowing increased nanoparticles and/or atomic clusters and/or atomic vapors 34 generation by the hollow cathode, which in turn can result in higher deposition rate and fabrication speed, at the point of fabrication 18.

The energy source 16 can be a primary heat source or a secondary heat source producing heat by an electromagnetic beam of coherent or incoherent light, electron or ion beam, induction, microwaves or ultrasound.

For example, the energy source 16 can be a laser source, such as a high power (1-10000 W) laser, or a high power diode laser (typical wavelength from 800 to 1100 nm, for example), a Nd:YAG laser (doubled, tripled or not), or a $CO_2$ laser, for example. A collimator or a focusing device 17 can be used to direct the beam generated by a laser source 16. Using a laser beam going through the hollow cathode allows obtaining nanoparticles and/or atomic clusters and/or atomic vapors 34 emitted by the hollow cathode 12 along the axis of the source, which optimizes interactions.

Figure 5:
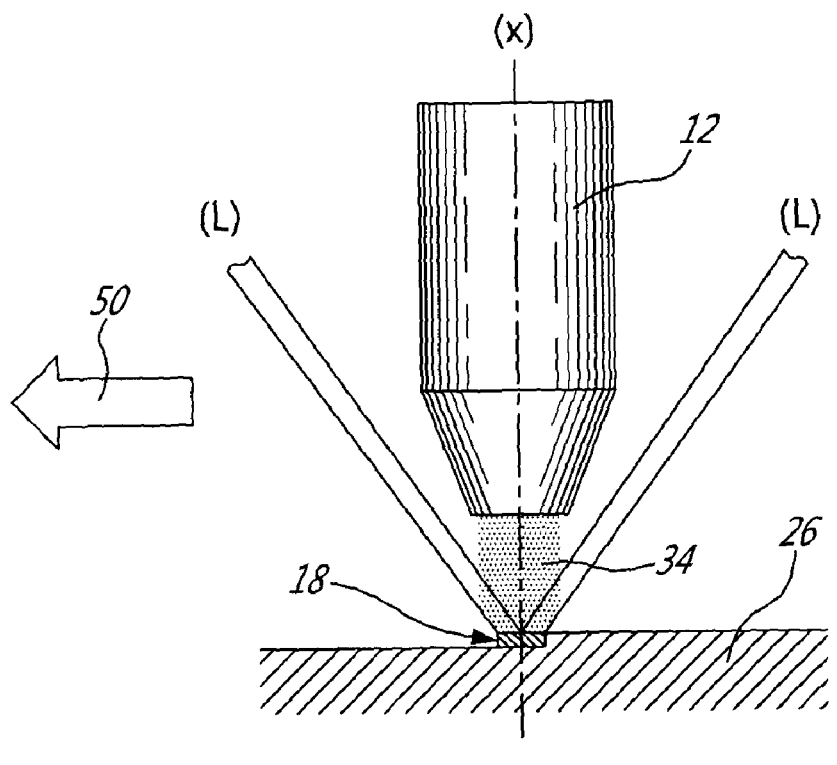
FIGS. 5 and 6 illustrate further embodiments of a system according to the first aspect of the present invention.

Depending on the emissivity of the material of the object being fabricated, it can be necessary to prevent reflections of the laser beam into the hollow cathode 12, which could damage the hollow cathode 12. As illustrated in FIG. 5, one or more laser beams (L) can be made to converge to the fabricating point 18, at an angle relative to the axis (X) (or to the median plan, if the hollow cathode 12 is made of plates) of the hollow cathode 12, in order to avoid reflection of the laser beam on the manufacturing head. The object 26 is fabricated as the manufacturing head moves in the direction indicated by arrow 50 for assembling the nanoparticles and/or atomic clusters and/or atomic vapors 34 with the laser beams (L).

The power of the energy source 16 is selected according to the desired deposition rate, the velocity of the construction head, the type of material deposited (including the emissivity and the conductivity of the material), the fabricating temperature ($T_{fab}$) and the size of the construction point (correlated to the size of the focal spot), etc. Also, when an RF power source is used to power the hollow cathode, the energy of the ion bombardment at the fabricating point has to be taken into account.

The energy source 16 has to provide sufficient energy to the nanoparticles and/or the atomic or cluster vapor generated by the hollow cathode 12 so that they merge and/or react with a substrate, a gas or another structure at the surface of the object being fabricated 26. Typically, the power of the energy source 16 has to be controlled and monitored in order to maintain an appropriate temperature ($T_{fab}$) at the fabricating point, for example $0.05 \cdot T_f \leq T_{fab} \leq 0.95 \cdot T_f$, where $T_f$ is the temperature of fusion of the material of the hollow cathode, or $0.1 \cdot T_f \leq T_{fab} \leq 0.5 \cdot T_f$ (temperatures in degrees Celsius).

As the particles generated by the cathode assemble at the surface of the object being fabricated 18 in absence of a molten pool at the surface of the object being fabricated 18, there is no significant thermal deformation in the object once fabricated. The nanoparticles, atom clusters or atoms simply add to the existing structure and build up the object. This is due to the fact that the fusion temperature of nanoparticles is much lower than in the macroscopic state.

It is to be noted that the plasma generated inside the hollow cathode 12 is a cold plasma, far from local thermal equilibrium (LTE) plasma, as its ionic temperature, of about $10^3$K, is very inferior to its electronic temperature, of at least about $10^4$K, in contrast to what happens in a plasma torch for example, where, as known in the art, both temperatures are similar and very high (typically in a range between $10^4$K and $3 \times 10^4$K, and can reach $10^5$K) and the plasma is considered hot. The present cold plasma, generated by accelerated electrons ionizing the gas, allows a precise control of the amount of matter ablated from the hollow cathode 12 since the atoms are ablated one by one by ions of the plasma. In contrast, in the case of a plasma torch, as known in the art, a gas injected between a cathode and an anode is ionized by an arc therebetween, which is emitted by the cathode by a thermo-ionic effect or by a field effect, the cathode being locally liquefied at the position of the arc, and the atoms being produced by a local surface fusion.

In the present invention, nanoparticles and/or atomic clusters and/or atomic vapors 34 emitted by the hollow cathode 12 can be assembled directly, the material forming the object 26 being the material of the hollow cathode 12.

The flow of nanoparticles and/or atomic clusters and/or atomic vapors 34 generated by the hollow cathode 12 can be controlled by reducing the diameter of the output of the hollow cathode or by adding a nozzle 52 as shown in FIGS. 1 and 2 for example. Alternatively, a magnetic field can be applied at the output of the hollow cathode to gather the emitted flow into a beam. As known in the art, a magnetic field applied coaxially to the hollow cathode will compress the plasma around the axis.

Figure 6:
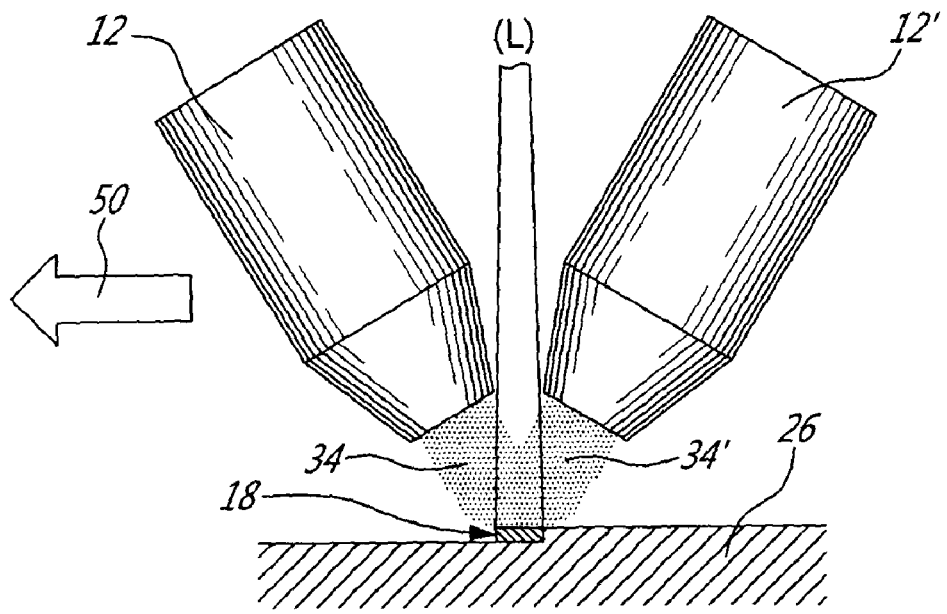

As shown in FIG. 6, a plurality of hollow cathodes can be used to fabricate an object formed of different materials for example. For instance, an object in a binary alloy can be made using two hollow cathodes working together simultaneously at the same point of construction 18. In this case for example, the directional energy source (typically a laser beam (L)) passes between the hollow cathodes 12, 12' to reach the point of construction 18, to which are also directed the nanoparticles and/or atomic clusters and/or atomic vapors 34, 34' generated by the hollow cathodes 12, 12' respectively. The object 26 is fabricated as the manufacturing head comprising hollow cathodes 12 and 12' moves in the direction indicated by arrow 50 and as the nanoparticles and/or atomic clusters and/or atomic vapors 34, 34' are assembled with the laser beam (L). Other configurations are possible, such as for example, using an hybrid cathode or using the system illustrated in FIG. 3 with different cathodes.

As shown in FIGS. 5 and 6, the beams of energy may be made to concentrate at the fabrication point 18 (FIG. 5) or to diverge slightly (FIG. 6).

The same principle can be applied to fabricate an object in a ternary alloy, using 3 hollow cathodes, and so on . . . . Cathodes made in an alloy can also be used directly, such as cathodes in stainless steel for example. Different combinations are possible such as, for example, a metal cathode, with a carbon or doped silicon cathode, to deposit carbides or silicates. Also it is possible to use multiple cathodes and inject a reactive gas and/or particles at the exit of one or more of the cathodes, or between the cathodes, or through the cathodes, in order to obtain a combination of materials as described hereinabove for one cathode.

Moreover, it can be contemplated combining the nanoparticles and/or atomic clusters and/or atomic vapors emitted by the hollow cathode with nanomaterials fed as powders, either at the output of the cathode or with the flow 32 (see FIG. 1) for example, to form new composite materials, such as alloys between carbon nanostructures and a metal or silicium, for example. In this example, since the metal nanoparticles are very reactive, they form carbide when contacting the carbon nanostructures, under supply of energy, which forms a tight bonding interface between the carbon and the metal. The carbon nanostructures can be carbon nanotubes, either multiwall or singlewall nanotubes, for example.

Exogenous materials can be added, within the hollow cathode or at the output thereof.

Turning back to FIGS. 1 to 3, a reactive gas and/or particles 30 can be added at the output of the hollow cathode, so that it reacts with the nanoparticles generated by the hollow cathode. For example, nanoparticles can be combined with CVD (chemical vapor deposition) chemical precursors to form alloys between a metal and a ceramic for instance. For example, by introducing oxygen in a very low amount at the output of a hollow cathode 12 made in aluminum, alumina particles can be created and these alumina particles combine with other aluminum nanoparticles to form a hybrid object 26, wherein the alumina strengthens the aluminum, while the electrical and thermal conductivities of aluminum are maintained.

Ceramics can be fabricated along the same line. For instance, in the setup described hereinabove, by saturating the output of the hollow cathode with oxygen, and thereby oxidizing all aluminum atoms and particles, an object formed of alumina can be fabricated.

When introducing particles and/or nanoparticles and/or reactives and/or monomers 32 directly inside the hollow cathode, an RF can be applied to the hollow cathode 12 (FIG. 1) for example for plasma stabilization and ablation of aggregates that form in the hollow cathode.

Other conductive materials can be contemplated, such as doped silicon to obtain silica for example. Moreover, when using silicon, the waste of material of the hollow cathode can be compensated by feeding the hollow cathode with silane, which supplies silicon to the hollow cathode. As a result, the cathode self regenerates.

The resulting objects can range from 1 mm to several meters in size, depending, in particular, if they are made in a vacuum chamber, in air, or in space. In a vacuum chamber, the size of the object is limited by the size of the chamber (also, an appropriate space must be left for the movements of the robot holding the construction head). In air and in space, the size is limited by the amount of material available, and the handling capability of the robot.

A number of computer-aided design (CAD), computer-aided manufacturing (CAM), and computer numerical control (CNC) directing methods can be used (with the number of axis necessary for describing the trajectory calculated by the CAM software) to control assembling of the particles on the support 20, which supports overhanging features during fabrication of the object. The temperature of the support material can be controlled so as to maintain constant fabrication parameters, by providing a temperature control unit 22 in contact with the support 20, as mentioned hereinabove in relation to FIGS. 1-3. Typically, the support 20 is a surface from which the object once fabricated is separated from: the support material 20 can be removed by heat or dissolved away with a solvent, acid, or water for example.

Alternatively, the object can be fabricated from a pre-existing object, the pre-existing object being in need of repair or of added features, for example.

The beams emitted by the hollow cathode and the heat source are directed using a guiding device such as a robot or a CNC system, for example, controlling the movement of the manufacturing head, for laying down successive cross-sections of the object to be fabricated at the point of fabrication. Alternatively, the manufacturing head can be fixed and the support surface 20, together with the temperature control unit 22 and the electrical insulator 24 if any, made to move. All movements may be controlled by a CNC system, and the trajectories of the CNC system are calculated by a CAM software, in order to make the object described in the CAD model. When using an initial support surface 20, the combined hollow cathode 12 and laser 16 are positioned along a normal to the curve describing a cross section under construction, and tangentially to the surface of the object supported by the curve. Depending on the complexity and symmetries of the object to be fabricated, a number of configurations are thus possible.

The method allows precise fabrication since it proceeds by addition of matter without contact. By using an energy source that can be focused to yield a focal spot of the order of the micrometer in diameter, together with nanoparticles that need only part of the heat needed to melt the macroscopic corresponding material, the present method allows high precision fabrication of objects that are mostly free of deformations.

Depending on the applications, a plurality of manufacturing heads can be used and automatically changed, in the way a tool change out mechanism operates in the case of a CNC machine. For example, if a large amount of material is needed at a time of the fabrication process, when fabricating a core part of the object for instance, the system can comprise a laser source, a large-sized hollow cathode and a lens yielding a large focal spot. When high precision is required, a small-sized hollow cathode coupled to a lens forming a small focal spot can be used. Obviously, the power of the source of energy needs to be adjusted according to the focal spot, the fabrication speed and the flow of gas and particles from the hollow cathode.

For molding an object on a support for example, the heat source is generally much more diffused than a laser, and can even be only used to heat the support surface. The support and the object can be separated by a boron nitride powder film, for example, to prevent adhesion. The support can be made in a fluorinated polymer, or with a metallic surface covered by a polymer such as Teflon™ or PEEK, or made in graphite or in boron nitride, or in any material preventing adhesion between the support and the object being made, depending on the material of the objet to be fabricated. Such molding method is adapted to fabricate objects having large surfaces and small thickness.

In the case of complex objects or imbricate objects for example, a supplementary support may be needed, at one point or another along the fabrication process, to fabricate the object. Metals having a low melting point, such as tin or aluminum for example, can be used for a support, provided that the local temperature at the point of construction 18 is lower than the melting temperature of the material of the support and that the melting temperature of the fabricated object is higher than that of the support. Once the object is fabricated, the support is melted to retrieve the object.

In the case of a refractory material, a support made in ceramic, such as alumina or silica for example, can be used and then dissolved with an acid that is inactive or mild towards most metals, such as hydrofluoric acid for example.

The support can be made in sodium chloride or other salts, or in calcium carbonate, for example. In the case of a support in sodium chloride for example, by using a hollow cathode made in sodium, with necessary care, and injecting chlorine at the output of the hollow cathode, salt nanoparticles are produced. These salt nanoparticles can be fused using an energy beam to form a local support for different parts of the object being fabricated. When fabrication of the object is over, it suffices to immerse the object in order to dissolve the salt and its support in water to release the object.

The present system and method allow fabrication of high precision objects having new mechanical, thermal, magnetic and/or electrical properties, by assembling nanoparticles.

By alternating the composition of the fabricated object, electrodes of a high specific surface and good mechanical resistance and conductivity can be fabricated.

High performance capacitors can be directly fabricated, in contrast to standard methods and systems (see for example U.S. Pat. No. 7,033,406), by alternating layers of insulating and of conductive materials assembled at the nanometric and/or atomic level.

Complex objects having a plurality of functions, including mechanical, electrical and magnetic functions for example, can be fabricated, such as, for instance, engines comprising permanent magnets and complex geometries, and electric or electronic circuits and thermocouples built in the bulk of the engine.

The present method and system can be used to repair aircrafts or satellites in space. Alternatively, spare parts can be fabricated in situ. It can even be contemplated fabricating space station and spacecraft parts, in an automated way and a minimized human intervention.

Although the present invention has been described hereinabove by way of specific embodiments thereof, it can be modified, without departing from the nature and teachings of the subject invention as defined in the appended claims.

The invention claimed is:

1. A system for fabricating a macroscopic object, comprising, in an environment:
   at least one energy source;
   at least one particle generator, comprising at least one material; and
   a support;
   wherein particle beams emitted by said at least one particle generator and energy beams emitted by said at least one energy source are directed to a point of fabrication on said support, and said particles emitted by said at least one particle generator are assembled at said point of fabrication under action of energy from said energy beams emitted by said at least one energy source, at a temperature $T_{fab}$, in degrees Celsius, at said point of fabrication, at least equal to a temperature of fusion of said particles and less than a temperature of fusion of the material of the particle generator having the same composition as said particles.

2. The system of claim 1, wherein said particles emitted by the particle generator are at least one of: atoms in the form of vapor, atoms in the form of plasma, atomic clusters, nanoparticles, and a mixture thereof.

3. The system of claim 1, wherein said particle generator is at least one hollow cathode separated from an anode by a bias potential, a flow of gas through the hollow cathode generating a hollow cathode discharge, particles emitted by the hollow cathode being assembled on said support under action of energy from the energy source.

4. The system of claim 3, wherein the environment includes a tension of the hollow cathode and a pressure satisfying the Pashen law $$V = \frac{a(pd)}{\ln(pd) + b}$$

where V is a breakdown voltage in Volts, p is the pressure in Torr, and d is a distance in cm between opposite walls of the hollow cathode in the gas, constants a and b depending on the composition of the gas.

5. The system of claim 3, wherein the hollow cathode is put under a negative DC tension below about −100V with a current in a range between 10 mA and 100 A, under a pressure in the range between a few mTorr and atmospheric pressure.

6. The system of claim 5, wherein the negative DC tension is in a range between −137V and −1000V.

7. The system of claim 3, wherein the hollow cathode is put under an AC current in a range between 10 W and 10 KW at radio frequencies.

8. The system of claim 3, wherein the flow of gas through the hollow cathode is in a range between 1 sccm and 10000 sccm.

9. The system of claim 3, wherein the hollow cathode is made in an electrically conductive material, said material being in a solid state at a working temperature.

10. The system of claim 3, wherein the anode is positioned on the support.

11. The system of claim 1, wherein the energy source is adapted to maintain a temperature $T_{fab}$, in degrees Celsius, at the point of fabrication on said support, where $0.05 \cdot T_f \leq T_{fab} \leq 0.95 \cdot T_f$, $T_f$ being the temperature of fusion of a material of the particle generator in degrees Celsius.

12. The system of claim 11, wherein the energy source is adapted to maintain a temperature $T_{fab}$, in degrees Celsius, at the point of fabrication on said support, where $0.1 \cdot T_f \leq T_{fab} \leq 0.5 \cdot T_f$, $T_f$ being the temperature of fusion of a material of the particle generator in degrees Celsius.

13. The system of claim 1, further comprising at least one temperature controlling unit to control a temperature of at least one of: the particle generator and the support.

14. The system of claim 1, further comprising at least one of: i) a focusing device and ii) a collimator directing a beam of energy from the energy source.

15. The system of claim 1, further comprising at least one of: i) a source of material for feeding the particle generator and ii) an exogenous source of material for reaction with the particles emitted by the particle generator.

16. The system of claim 1, further comprising an exogenous source of at least one of: powders, nanoparticles and reactive gas for reaction with the particles emitted by the particle generator.

17. The system of claim 1, wherein said energy source is one of: a laser, an electron beam, an ion beam an induction source, a microwave source and an ultrasound source.

18. The system of claim 1, wherein said particle generator is made in at least one of metals, alloys and non-metals.

19. The system of claim 18, further comprising a guiding device, said guiding device controlling a movement of at least one of: i) the particle generator and ii) the support.

20. The system of claim 1, further comprising a nozzle at an output of said particle generator.

21. The system of claim 1, wherein said support is a pre-existing object, the particles emitted by the particle generator being assembled as additional features on said pre-existing object under action of energy from the energy source.

22. The system of claim 1, wherein said macroscopic object is a layer.

23. The system of claim 1, wherein the particles emitted by the particle generator are assembled into a composite material under action of energy from the energy source.

24. A method for fabricating an object on a support in an environment, comprising:
selecting at least one hollow cathode according to a composition of the object to be fabricated;
selecting at least one energy source according to a size of the object to be fabricated;
starting a flow of gas through the hollow cathode;
establishing a potential bias between the hollow cathode and an anode at a controlled pressure satisfying:

$$V = \frac{a(pd)}{\ln(pd) + b}$$

where V is a breakdown voltage in Volts, p is the pressure in Torr, and d is a distance in cm between opposite walls of the hollow cathode in the gas, constants a and b depending on the composition of the gas;
starting the energy source; and
directing a beam of particles emitted by the hollow cathode and energy from the energy source to a point of fabrication on the support;
wherein said step of selecting at least one energy source comprises selecting an energy source adapted to maintain a temperature $T_{fab}$, in degrees Celsius, at the point of fabrication, at least equal to a temperature of fusion of the particles and less than a temperature of fusion of a material of the hollow cathode.

25. The method of claim 24, wherein said step of establishing a potential bias between the hollow cathode and an anode comprises putting the hollow cathode to a negative DC tension below −100V, with a current in a range between 10 mA and 100 A, under a pressure in a range between a few mTorr and atmospheric pressure.

26. The method of claim 25, wherein the negative DC tension is in a range between −137V and −1000V.

27. The method of claim 24, wherein said step of establishing a potential bias between the hollow cathode and an anode comprises applying an AC current in a range between 10 W and 10 KW at radio frequencies.

28. The method of claim 24, wherein said step of selecting an energy source comprises selecting an energy source adapted to maintain a temperature $T_{fab}$, in degrees Celsius, at the point of fabrication on the support, where $0.05 \cdot T_f \leq T_{fab} \leq 0.95 \cdot T_f$, $T_f$ being the temperature of fusion of a material of the hollow cathode in degrees Celsius.

29. The method of claim 28, wherein said step of selecting an energy source comprises selecting energy source adapted to maintain a temperature $T_{fab}$, in degrees Celsius, at the point of fabrication on the support, where $0.1 \cdot T_f \leq T_{fab} \leq 0.5 \cdot T_f$, $T_f$ being the temperature of fusion of a material of the hollow cathode in degrees Celsius.

30. The method of claim 24, wherein said step of selecting an energy source comprises at least one of: focusing and collimating a beam of energy from the energy source.

31. The method of claim 24, wherein said starting a flow of gas through the hollow cathode comprises flowing a gas at a flow rate comprised in a range between 1 sccm and 10000 sccm.

32. The method of claim 24, further comprising controlling a flow of the particles emitted by the hollow cathode.

33. The method of claim 24, comprising changing the hollow cathode.

34. The method of claim 24, comprising feeding the hollow cathode by an external source of material.

35. The method of claim 34, comprising feeding the hollow cathode by at least one external source of at least one of: powders, nanoparticles and reactive gas.

36. The method of claim 24, further comprising reacting exogenous material with the particles emitted by the hollow cathode.

37. The method of claim 36, comprising reacting at least one of: powders, nanoparticles and reactive gas with the particles emitted by the hollow cathode.

38. The method of claim 24, performed in one of: a vacuum chamber, a controlled atmosphere chamber, air, and space.

39. A method for fabricating an object on a support in an environment, comprising:
selecting at least one particle generator according to a composition of the object to be fabricated;
selecting at least one energy source according to a size of the object to be fabricated;
starting the particle generator;
starting the energy source; and
directing a beam of particles emitted by the particle generator and energy from the energy source to a point of fabrication on the support;
wherein said step of selecting at least one energy source comprises selecting an energy source adapted to maintain a temperature $T_{fab}$, in degrees Celsius, at the point of fabrication, at least equal to a temperature of fusion of the particles and less than a temperature of fusion of a material of the particle generator.

* * * * *